US008351620B2

(12) United States Patent
Arakawa

(10) Patent No.: US 8,351,620 B2

(45) Date of Patent: Jan. 8, 2013

(54) VOLUME ADJUSTER

(75) Inventor: Tomonori Arakawa, Kanagawa (JP)

(73) Assignee: Sony Corporation (JP)

( * ) Notice: Subject to any disclaimer, the term of this patent is extended or adjusted under 35 U.S.C. 154(b) by 1002 days.

(21) Appl. No.: 10/512,236

(22) PCT Filed: Feb. 19, 2004

(86) PCT No.: PCT/JP2004/001909

§ 371 (c)(1),
(2), (4) Date: Jun. 13, 2005

(87) PCT Pub. No.: WO2004/077823

PCT Pub. Date: Sep. 10, 2004

(65) Prior Publication Data

US 2005/0232444 A1 Oct. 20, 2005

(30) Foreign Application Priority Data

Feb. 26, 2003 (JP) ................................ P2003-049670

(51) Int. Cl.
*H03G 3/00* (2006.01)

(52) U.S. Cl. ........... 381/104; 381/105; 381/107; 700/94

(58) Field of Classification Search .................... 700/94; 381/104–105, 107, 109, 119, 103
See application file for complete search history.

(56) References Cited

U.S. PATENT DOCUMENTS 5,222,150 A * 6/1993 Tajima .......................... 381/105
5,745,583 A * 4/1998 Koizumi et al. ................ 381/86
5,883,963 A * 3/1999 Tonella .......................... 381/104
6,747,678 B1 * 6/2004 Katayama et al. ............ 715/773
6,901,148 B2 * 5/2005 Yoshino et al. ............... 381/103
7,191,024 B2 * 3/2007 Kano et al. ....................... 700/94
7,430,412 B1 * 9/2008 Steen ............................ 455/423
7,610,553 B1 * 10/2009 Jacklin et al. ................. 715/727
2002/0076072 A1 * 6/2002 Cornelisse ..................... 381/312
2003/0044028 A1 * 3/2003 Cranfill et al. ................ 381/107

FOREIGN PATENT DOCUMENTS

JP 10-313224 A 11/1998
JP 11-355684 A 12/1999
JP 2001-44774 A 2/2001
JP 2004-112677 A 4/2004

* cited by examiner

*Primary Examiner* — Disler Paul

(74) *Attorney, Agent, or Firm* — Lerner, David, Littenberg, Krumholz & Mentlik, LLP

(57) ABSTRACT

The present invention can adjust a volume of a sound on the basis of sound signals to suit a user's preference.

The present invention arbitrarily sets movement settable control values application range DR2 for a plurality of continuous preamp control values PD from a desired minimum preamp control value PD to a desired maximum preamp control value PD against a group of preamp control available values PDS. Thus, the present invention can control gains so as to compensate external sound signals with different signal levels supplied from external input terminal OI for difference of signal level according to the external sound signal or can control gains in a predetermined range according to the signal level so that the volume of the external sound on the basis of the external sound signals can be arbitrarily adjusted in a range between a desired minimum value and a desired maximum value. In this manner, a volume of a sound on the basis of an external sound signal can be adjusted.

6 Claims, 8 Drawing Sheets

T100

| | | 0I1 | 0I2 | 0I3 |
|---|---|---|---|---|
| 0I | EXTERNAL INPUT TERMINAL | VIDEO 1 (DIGITAL BROADCASTING RECEIVER) | VIDEO 2 (DVD PLAYER) | VIDEO 3 (VTR) |
| RLs | APPLICATION RANGE SETTING VALUE | +2 | −1 | +3 |
| PD | PREAMP CONTROL VALUE (MINIMUM) | 38 | 2C | 3A |
| VM | VOLUME INDICATOR (MINIMUM) | 1 | 1 | 1 |
| | | DIGITAL SATELLITE SOUND CONTROL INFORMATION | DVD SOUND CONTROL INFORMATION | VIDEO SOUND CONTROL INFORMATION |

RF: SET CONTROL VALUES APPLICATION RANGE INFORMATION (RLs, PD)

VF: VOLUME INDICATOR CORRELATION INFORMATION (PD, VM)

FIG. 7

VOLUME ADJUSTER

CROSS-REFERENCE TO RELATED APPLICATIONS

The present application is a national stage application under 35 U.S.C. §371 of International Application No. PCT/JP2004/001909, filed Feb. 19, 2004, which claims priority from Japanese Application No. P2003 049670, filed Feb. 26, 2003, the disclosures of which are hereby incorporated by reference herein.

BACKGROUND OF THE INVENTION

1 Technical Field

This invention relates to a volume adjuster and is preferably applicable to a television receiver that can capture terrestrial television transmission signals to a plurality of channels for terrestrial television broadcasting or external image and sound signals supplied from an outside appliance and output a program image and sound on the basis of the terrestrial television transmission signals or an external image and sound on the basis of the external image and sound signals for an audience.

2 Background Art

Signal levels of terrestrial television sound signals included in terrestrial television signals and signal levels of outside sound signals included in outside image and sound signals are different. When an output is switched from an outside image and sound to a program image and sound, or when an output is switched from a program image and sound to an outside image and sound, conventional television receivers match the volume of a program sound on the basis of terrestrial television sound signals and the volume of an outside sound on the basis of outside sound signals by matching the signal level of the outside sound signals with that of the terrestrial television sound signals to output an outside image and sound on the basis of outside image and sound signals (For example, refer to Patent reference 1)

Patent Reference 1 Japanese Patent Laid-Open No. 11-355684 (Page 4 and FIG. 1)

As the television receivers with the abovementioned configuration matches the signal level of outside sound signals with that of terrestrial television sound signals, a range from the minimum to the maximum of an adjustable volume of an outside sound on the basis of the outside sound signals within a predetermined volume control range is matched with a range from the minimum to the maximum of an adjustable volume of an program sound on the basis of the terrestrial television sound signals within the volume adjustable range.

This leads a problem in that a volume of a program sound or an external sound cannot be controlled to suit a user's preference within a volume control range from the desired minimum to the desired maximum in the abovementioned television receivers.

SUMMARY OF THE INVENTION

This invention has been made in view of the foregoing, and is to provide a volume adjuster that allows a user to adjust the volume of a sound on the basis of sound signals to suit the user's preference.

To solve the abovementioned problem, the present invention adjusts a volume of a sound on the basis of sound signals by determining a plurality of gains control values used for controlling the volume of the sound on the basis of the sound signals within multiple gains control values in a group of gains control available values according to a control values application range arbitrarily selected in the group of gains control available values stored in a storage means that has previously stored multiple gains control values used for controlling gains of sound signals in the form of a group of gains control available values, in which values from a gains control value for minimizing a volume of a sound through gains control values for gradually increasing the volume of the sound to the maximum are set orderly, so as to adjust a sound on the basis of the sound signals to each of different multiple volumes; and controlling gains of the sound signals by using gains control values corresponding to an arbitrarily specified volume of a sound of a plurality of gains control values within a control values application range.

In this manner, a volume of a sound on the basis of the sound signals can be arbitrarily adjusted within a range from a desired minimum to a desired maximum by controlling gains to compensate sound signals whose signal level depends on the signal type for difference of signal level according to the signal type, or by controlling gains within a desired range corresponding to the signal level.

BRIEF DESCRIPTION OF THE DRAWINGS

FIG. 7 is a brief diagram showing a configuration of a control values application range setting table.

DETAILED DESCRIPTION

Best Mode for Carrying Out the Invention

Figure 1:
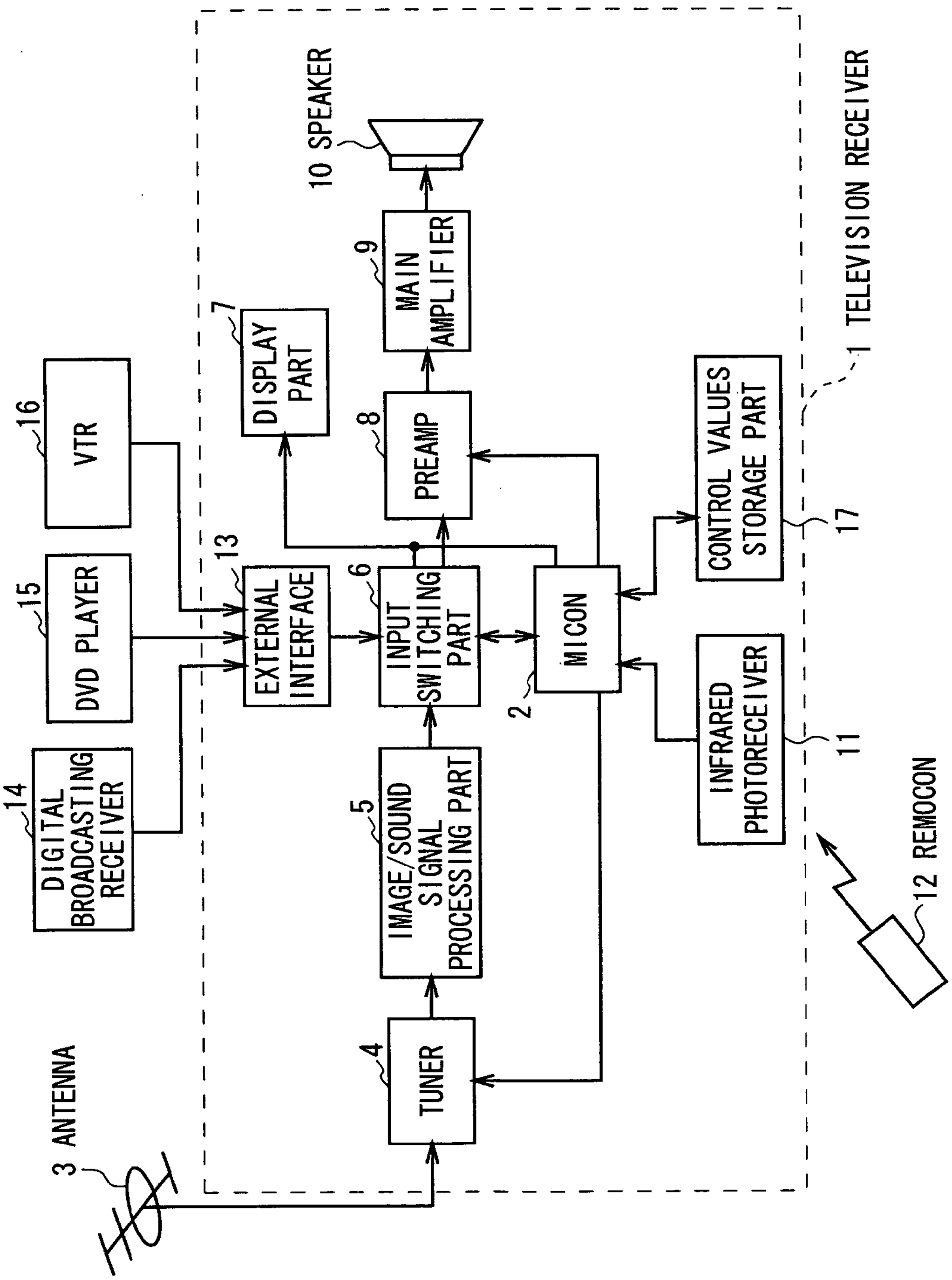
FIG. 1 is a block diagram of circuitry of a television receiver according to the present invention.

Preferred embodiments of this invention will be described with reference to the accompanying drawings:

In FIG. 1, reference numeral 1 denotes a circuitry of a television receiver to which the present invention is applied. Infrared photoreceiver 11, which receives an infrared ray signal emitted from a remote adjuster (hereinafter referred to as "remocon") 12, is connected to a microcomputer (hereinafter referred to as "micon") 2, which includes CPU (Central Processing Unit) (not shown), internal memory, etc.

Micon 2 as information association means and control values application range determination means is adapted to output various images and sounds for an audience by controlling each circuit block in a centralized manner according to the various programs that are stored in internal memory (not shown) on the basis of various commands corresponding to the infrared ray signals provided from the infrared photoreceiver 11, when an infrared ray signal corresponding to each of various commands input by a user on remocon 12, as an application range selection means, a volume specifying means and a movement specifying means, is emitted from remocon 12 and the signal is received at infrared photoreceiver 11.

That is to say, micon 2 activates television receiver 1 in response to an activation command for television receiver 1 input via remocon 12, sets the mode to ground wave program viewing mode for viewing a terrestrial television broadcasting program, and captures into tuner 4 terrestrial television transmission signals for a plurality of analog channels of a terrestrial television broadcasting that are received via antenna 3.

Tuner 4 selects terrestrial television transmission signals for a desired channel specified by the user via remocon 12 from terrestrial television transmission signals for a plurality of channels captured from antenna 3 and sends the signals to image/sound signal processing part 5.

Image/sound signal processing part 5 separates terrestrial television image signals and terrestrial television sound signals contained in the terrestrial television transmission signals by performing a predetermined process on the terrestrial television transmission signals and outputs the terrestrial television image signals to display part 7 via input switching part 6 as well as outputs the terrestrial television sound signals to preamp 8 via input switching part 6.

Then micon 2 displays television program image for the desired channel on the basis of the terrestrial television image signals on display part 7 as volume information display means.

Preamp 8 outputs a television program sound of the desired channel on the basis of gains control television sound signals from speaker 10 in synchronization with television program image by controlling gains of the terrestrial television sound signals according to the volume of a television program sound on the basis of terrestrial television sound signals specified via remocon 12 and sending the obtained gains control television sound signals to speaker 10 through main amplifier 9 that amplifies the signals in a certain amplification factor.

In this manner, micon 2 can provide the audience with the television program image and sound of a desired channel being on air in terrestrial television broadcasting.

External interface 13 is also connected to Micon 2 through the input switching part 6.

External interface 13 has a plurality of external input terminals (not shown), to which outside appliances such as a receiver for digital satellite broadcasting (hereinafter referred to as digital broadcasting receiver) 14, DVD (Digital Versatile Disk) player 15 and video tape recorder 16 is connected.

When a digital broadcasting selection command for viewing a digital satellite broadcasting program is input via remocon 12, micon 2 responds to the command by switching the mode to digital broadcast viewing mode.

Then digital satellite transmission signals for a desired channel specified by a user among digital satellite transmission signals for a plurality of digital satellite broadcasting channels are supplied from digital broadcasting receiver 14 in the form of digital satellite image signals and digital satellite sound signals contained therein. Micon 2 captures the digital satellite image signals and digital satellite sound signals into input switching part 6 via external interface 13, while sending the digital satellite image signals to display part 7 and digital satellite sound signals to preamp 8 instead of, for example, terrestrial television image signals and terrestrial television sound signals selected on tuner 4 from the input switching part 6.

Then micon 2 outputs a satellite program sound on the basis of gains control satellite sound signals in synchronization with a satellite program image by displaying a satellite program image on the basis of digital satellite image signals on display part 7, while controlling gains of digital satellite sound signals according to a volume of a satellite program sound on the basis of digital satellite sound signals currently specified via remocon 12 and sending the obtained gains control satellite sound signals to speaker 10 through main amplifier 9 that amplifies the signals in a certain amplification factor.

When a DVD selection command for viewing a DVD playback image and sound obtained by playing a DVD is input via remocon 12, micon 2 responds to the command by switching the mode to DVD playback viewing mode.

Then DVD playback image signals and DVD playback sound signals obtained by playing a DVD are supplied from DVD player 15. Micon 2 captures the DVD playback image signals and DVD playback sound signals into input switching part 6 via external interface 13, while sending DVD playback image signals to display part 7 and DVD playback sound signals to preamp 8 instead of, for example, terrestrial television image signals and terrestrial television sound signals selected on tuner 4 from the input switching part 6.

Then micon 2 outputs a DVD playback sound on the basis of gains control DVD playback sound signals in synchronization with a DVD playback image by displaying a DVD playback image on the basis of DVD playback image signals on display 7, while controlling gains of DVD playback sound signals according to a volume of a DVD playback sound on the basis of DVD playback sound signals currently specified via remocon 12 and sending the obtained gains control DVD playback sound signals to speaker 10 via main amplifier 9 that amplifies the signals in a certain amplification factor.

When a video selection command for viewing a video playback image and sound obtained by playing a video tape is input via remocon 12, micon 2 responds to the command by switching the mode to video playback viewing mode.

Then video playback image signals and video playback sound signals obtained by playing a video tape are supplied from video tape recorder 16. Micon 2 captures the video playback image signals and video playback sound signals into input switching part 6 via external interface 13, while sending video playback image signals to display part 7 and video playback sound signals to preamp 8 instead of, for example, terrestrial television image signals and terrestrial television sound signals selected on tuner 4 from the input switching part 6.

Then micon 2 outputs a video playback sound on the basis of gains control image playback sound signals in synchronization with video playback image by displaying video playback image on the basis of video playback image signals on display 7, while controlling gains of video playback sound signals in preamp 8 according to a volume of video playback sound on the basis of video playback sound signals currently specified via remocon 12 and sending the obtained gains control video playback sound signals to speaker 10 via main amplifier 9 that amplifies the signals in a certain amplification factor.

Each signal level of terrestrial television sound signals or digital satellite sound signals, DVD playback sound signals, and video playback sound signals to be captured in television receiver 1 is arbitrarily set by each terrestrial television program producing company or digital satellite television program producing company, DVD producing company, and video tape producing company.

Figure 2:
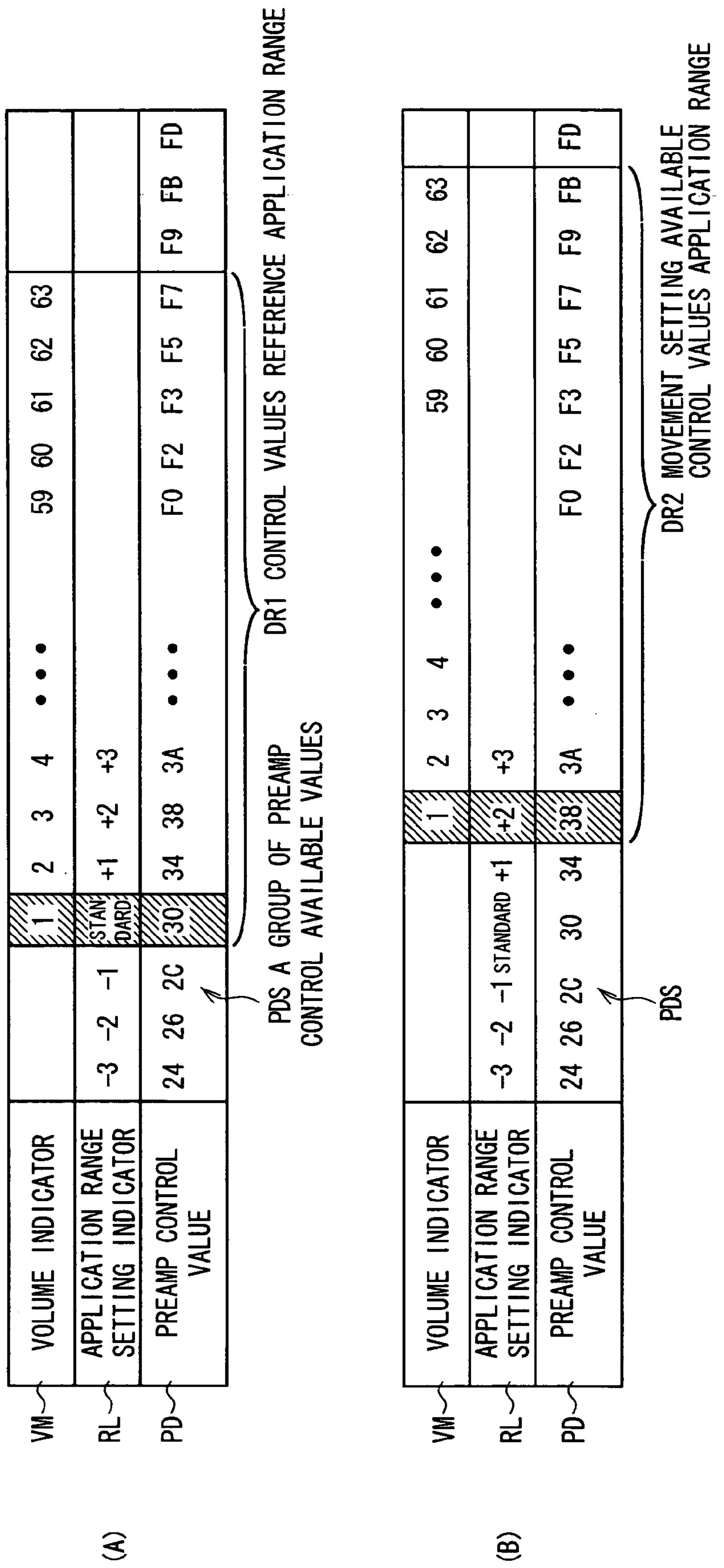
FIG. 2 is a brief diagram showing the setting of control values application range in a group of preamp control available values.

Thus, as shown in FIGS. 2(A) and (B), control values storage part 17 connected to micon 2 has previously stored multiple gains control values (hereinafter referred to as preamp control values) PD used for controlling gains of sound signals at preamp 8 as a group of gains control available values (hereinafter referred to as a group of preamp control available values) PDS, in which preamp control values PD are ordered from a preamp control value PD for minimizing a volume of a sound through preamp control values PD for gradually increasing the volume of the sound to the maximum (in this case, 69 preamp control values PD expressed as "24" to "FD" in hexa notation, for example) in order to adjust a sound on the basis of sound signals to be multiple different volumes.

Then, micon 2 uses the preamp control values PD that can gradually increase the volume of the sound from a desired minimum value to a desired maximum value, for example 63 preamp control values PD, among 69 preamp control values PD in a group of preamp control available values PDS for actually controlling gains of a sound signals at preamp 8.

Actually, micon 2 consistently uses 63 preamp control values PD in a control values application range (hereinafter referred to as control values reference application range) DR1, which is a middle part of each preamp control values PD in a group of preamp control available values PDS except for three minimum values and three maximum values (i.e., continuous preamp control values PD from "30" to "F7" in hexa notation) for controlling gains of terrestrial television sound signals.

In this case, micon 2 stores information on a control values reference application range DR1 indicating preamp control values PD used for controlling gains of terrestrial television sound signals and information on volume indicators VM associated with the preamp control values PD in control values storage part 17 as ground wave volume adjustment information. Each of sixty-three preamp control values PD is associated with each piece of numeral volume information (hereinafter referred to as a volume indicator) VM ranging from "1" to "63", which relatively represents the volume of a television program sound that can be adjusted with the 63 preamp control values PD (i.e., the minimum value of preamp control values PD "30" is associated with a volume indicator VM "1", the rest preamp control values PD are associated with volume indicators VM "2", "3", . . . in an increasing manner as the value increases, and the maximum value of preamp control values PD "F7" is associated with a volume indicator VM "63").

When the volume adjustment button (not shown) on remocon 12 is manipulated in ground wave program viewing mode, micon 2 reads a volume indicator VM associated with a preamp control value PD used for controlling gains of terrestrial television sound signals from control values storage part 17 according to ground wave volume adjustment information and displays the volume indicator VM superimposed on what is currently displayed on display 7, for example on a television program image in a gradually changing manner.

Thus, micon 2 is adapted to recognize the numeral of volume indicator VM displayed on display part 7 as a specification for the volume of a television program sound, read a preamp value PD associated with volume indicator VM displayed on the display part 7 from control values storage part 17, obtain gains control television sound signals by controlling gains of terrestrial television sound signals at preamp 8 with the read out preamp control value PD, and output the signals from speaker 10 by adjusting the volume of a television program sound on the basis of the gains control television sound signals.

If it is assumed that control values reference application range DR1 for controlling gains of terrestrial television sound signals is considered as a reference, a group of preamp control available values PDS has three preamp control values PD (preamp control values PD from "24" to "2C" in hexa notification) smaller than the minimum preamp control value PD within the control values reference application range DR1 at the area smaller than the control value reference application range PD as a margin, and three preamp control values PD (preamp control values PD from "F9" to "FD" in hexa notification) larger than the maximum preamp control value PD within the control value reference application range DR1 at the area larger than the control value reference application range DR1 as a margin.

Thus, micon 2 is adapted to set control values application range (hereinafter referred as movement settable control values application range) DR2 for making actually continuous 63 preamp control values PD to be used for controlling gains of digital satellite sound signals, DVD playback sound signals and video playback sound signals except for terrestrial television sound signals for a group of preamp control available values PDS, as shown in FIG. 2B.

In this case, micon 2 can move movement settable control values application range DR2 by three preamp control values PD at the area smaller than the control value reference application DR1 without changing the length of the range and also can move the range by three preamp control values PD at the area larger than the control value reference application value DR1. Thus, the micon 2 indicates the movable range of movement settable control values application range DR2 at preamp control values ranging from the minimum preamp control value PD to the maximum six preamp control values PD in a group of preamp control available values PDS (i.e., preamp control values PD from "24" to "3A" in hexa notification) and stores the indicated movable range in control values storage part 17 where application range setting indicators RL indicating a moving values ("−3" to "+3") are orderly associated within the range.

An application range setting indicator RL is associated with the minimum preamp control value PD of the control value reference application range DR1 in a group of preamp control available values PDS as characters "STANDARD"; associated with smaller preamp control values PD as numbers "−1", "−2", and "−3" in order at the area smaller than the minimum preamp control value PD of the control value reference application range DR1; and associated with larger preamp control values PD as numbers "+1", "+2", and "+3" in order at the area larger than the minimum preamp control value PD of the control value reference application range DR1.

Micon 2 matches each of movement settable control values application ranges DR2 of preamp control values PD used for controlling gains of digital satellite sound signals, DVD playback sound signals, and video playback sound signals with a control value reference application range DR1 as initial settings and associates a volume indicator VM with each of the preamp control values PD within the movement settable control values application range DR2 in the same manner for a control values application range DR1, and stores information on the movement settable control values application range DR2 and information on the volume indicator VM associated with a preamp control value PD as digital satellite volume adjustment information, DVD volume adjustment information, and video volume adjustment information in control values storage part 17.

Micon 2 is also adapted to process data application range setting for changing and resetting movement settable control values application range DR2 of a preamp control value PD used for controlling gains of digital satellite sound signals, DVD playback sound signals, and video playback sound signals captured from outside. Micon 2 resets movement settable control values application range DR2 by moving the range along the sequence of preamp control values PD for a group of preamp control available values PDS in response to manipulation on remocon 12 and associates 63 preamp control values PD within the reset movement settable control values application range DR2 with volume indicators VM consisting of numerals "1" to "63" (e.g., associates the minimum preamp control value PD within movement settable control values application range, "38", with volume indicator VM "1", associates the rest preamp control values PD with volume indicators VM "2", "3", . . . in an increasing manner as the value increases, and associates the maximum preamp control value PD, "FD", with volume indictor VM "63"), and adds information on the movement settable control values application range DR2 and information on a volume indicator VM associated with a preamp control value PD to control values storage part 17 as digital satellite volume adjustment information, DVD volume adjustment information, and video volume adjustment information.

When volume adjustment button (not shown) on remocon 12 is manipulated in digital broadcast viewing mode, DVD playback viewing mode, or DVD playback viewing mode is manipulated, micon 2 reads a volume indicator VM associated with a preamp control value PD used for controlling gains of digital satellite sound signals, DVD playback sound signals or video playback sound signals from control values storage part 17 according to digital satellite volume adjustment information, DVD volume adjustment information or video volume adjustment information in response to the mode, and displays the volume indicator VM superimposed on a satellite program image, a DVD playback image or a video playback image currently displayed on display part 7 in a gradually changing manner.

Thus, micon 2 is adapted to recognize the numeral of volume indicator VM displayed on display part 7 as a specification for the volume of a satellite program sound, a DVD playback sound, or an video playback sound, read a preamp control value PD associated with volume indicator VM displayed on the display part 7 from control values storage part PD, obtain gains control satellite sound signals, gains control DVD sound signals, or gains control video sound signals respectively (hereinafter referred to as gains control external sound signals collectively) by controlling gains of digital satellite sound signals, DVD playback sound signals, or video playback sound signals at preamp 8 with the read out preamp control value PD, and output the signals from speaker 10 by adjusting the volume of a satellite program sound, a DVD playback sound, or a video playback sound (hereinafter referred to as external sound collectively) on the basis of the gain control external sound signals.

Figure 3:
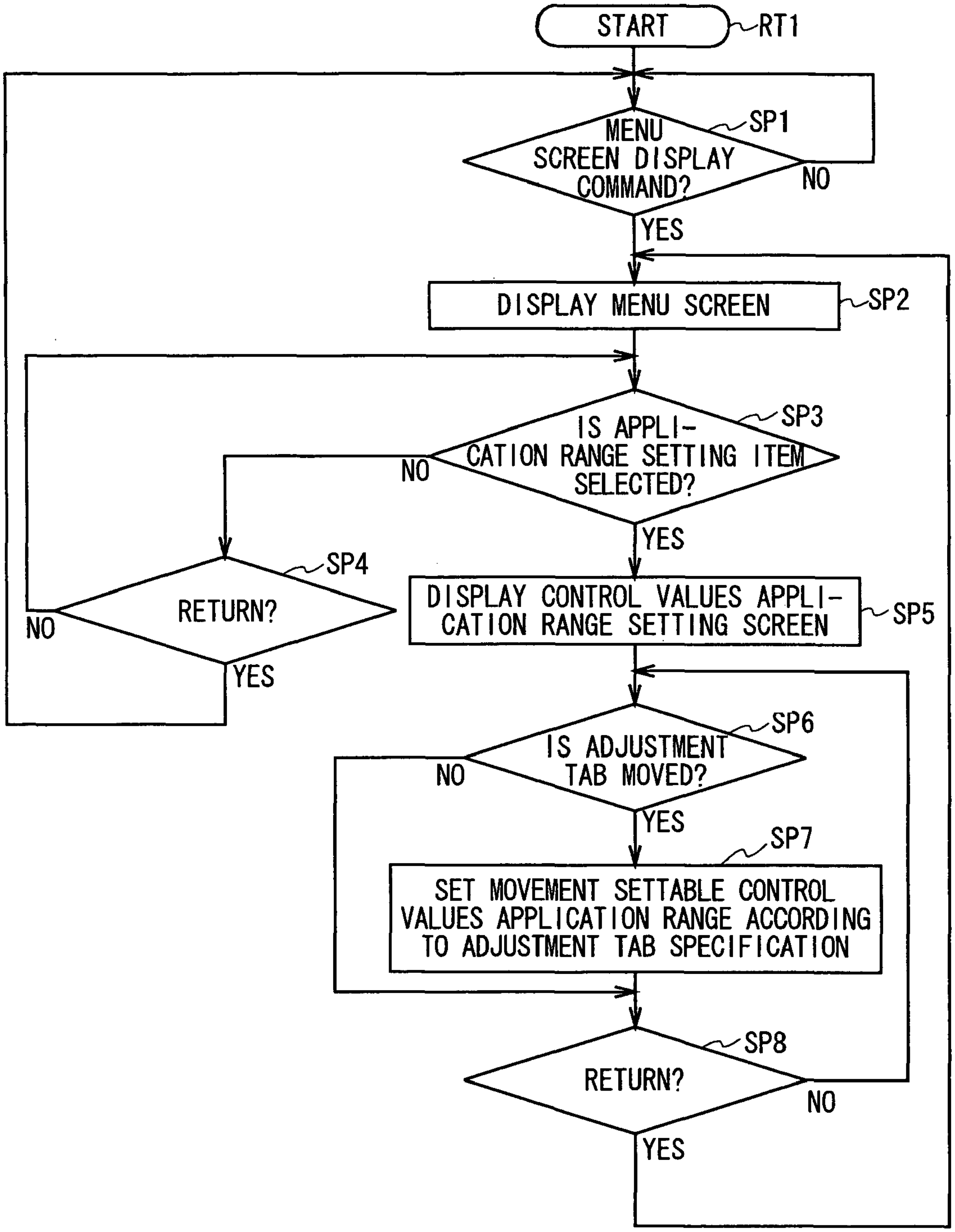
FIG. 3 is a flowchart showing a control values application range setting procedure.

Now, control values application range setting processing in television receiver 1 will be described below with reference to a flowchart shown in FIG. 3.

Micon 2 enters routine RT1 from start step and continues to step SP1 according to a control values application range setting-processing program stored in internal memory. At step SP1, micon 2 waits for a menu screen display command requesting to display a menu screen for various sound setting via remocon 12.

If the result obtained at step SP1 is positive, meaning adjusting of a tone or setting of movement settable control values application range DR2 is requested by entering a menu screen display command via remocon 12, micon 2 continues to the next step SP2.

Figure 4:
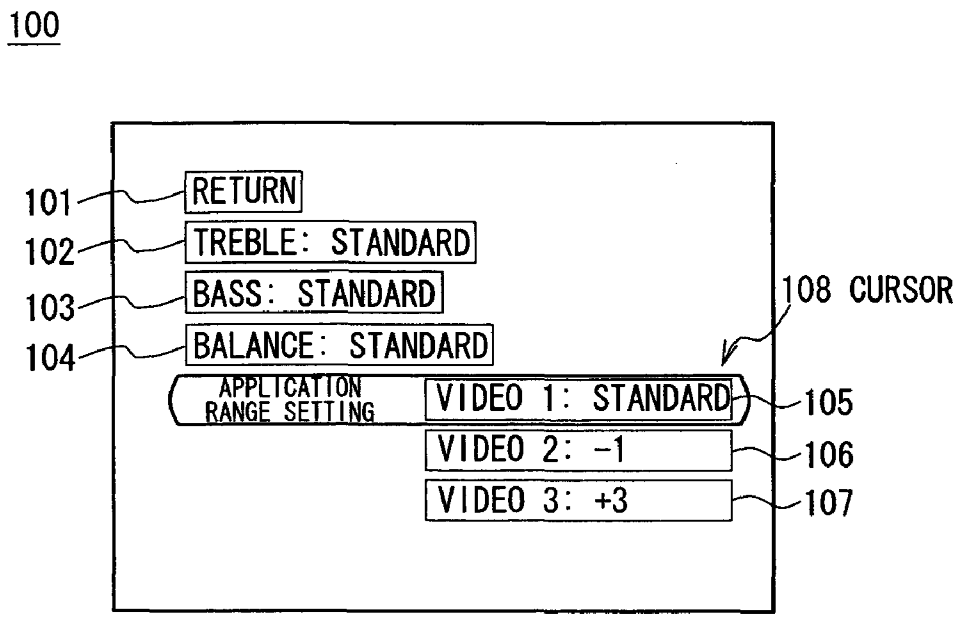
FIG. 4 is a brief diagram showing a configuration of a menu screen.

At step SP2, micon 2 displays menu screen 100 as shown in FIG. 4 on display 7 by reading menu screen signals from internal memory and sending the signals to the display 7 according to the menu screen display command, and continues to the next step SP3.

On menu screen 100, "RETURN" item 101 for returning to the display previous to the menu screen 100, for example, a display of a television program image, "TREBLE" item 102 for adjusting tone of a treble part of a television program sound, "BASS" item 103 for adjusting tone of bass part of a television program sound, "BALANCE" item 104 for adjusting a right-left balance for outputting a television program sound from speaker 10 in stereo, and "APPLICATION RANGE SETTING" items 105 to 107 for changing the setting of movement settable control values application range DR2 against a group of preamp control available values PDS for each external input terminal (for examples, referred to as "VIDEO 1", "VIDEO 2", "VIDEO 3") are provided.

In this case, in "APPLICATION RANGE SETTING" item 105 displays "VIDEO 1" indicating an external input terminal connected with digital broadcasting receiver 14, for example and an application range setting indicator RL against the minimum preamp control value PD within movement settable control values application range DR2 used for controlling gains of digital satellite sound signals.

In "APPLICATION RANGE SETTING" item 106 displays "VIDEO 2" indicating an external input terminal connected with DVD player 15, for example, and an application range setting indicator RL against the minimum preamp control value PD within movement settable control values application range DR2 used for controlling gains of DVD playback sound signals.

In "APPLICATION RANGE SETTING" item 107 displays "VIDEO 3" indicating an external input terminal connected with video tape recorder 16, for example, and an application range setting indicator RL against the minimum preamp control value PD within movement settable control values application range DR2 used for controlling gains of video playback sound signals.

When any item is selected by moving cursor 108 on menu screen 100 in response to manipulation on remocon 12, micon 2 performs a process according to the selected item.

At step SP3, micon 2 determines whether any item is selected from "APPLICATION RANGE SETTING" items 105 to 107 on menu screen 100 via remocon 12 or not.

If the result obtained at step SP3 is negative, meaning that the user does not request to set (or change) movement settable control values application range DR2 against a group of preamp control available values PDS as none of "APPLICATION RANGE SETTING" items 105 to 107 is not selected, micon 2 continues to the next step SP4.

At step SP4, micon 2 determines whether "RETURN" item 101 is selected on menu screen 100 via remocon 12 or not.

If the result obtained at step SP4 is positive, meaning that the user requests to return from a display of menu screen 100 to a display of a television program image on the basis of terrestrial television image signals, for example, micon 2 switches the display from menu screen 100 to a television program image and continues to step SP1.

If the result obtained at step SP4 is negative, meaning that any of "TREBLE" item 102, "BASS" item 103 or "BALANCE" item 104 other than "RETURN" item 101 and "APPLICATION RANGE SETTING" items 105 to 107 is selected on menu screen 100 via remocon 102, micon 2 continues to step SP3.

If the result obtained at step SP3 is positive, meaning that the user requests to set (or change) movement settable control values application range DR2 against a group of preamp control available values PDS for controlling gains of digital satellite sound signals, DVD playback sound signals or video playback sound signals as any of "APPLICATION RANGE SETTING" items 105 to 107 is selected on menu screen 100 via remocon 12, micon 2 continues to the next step SP5.

Figure 5:
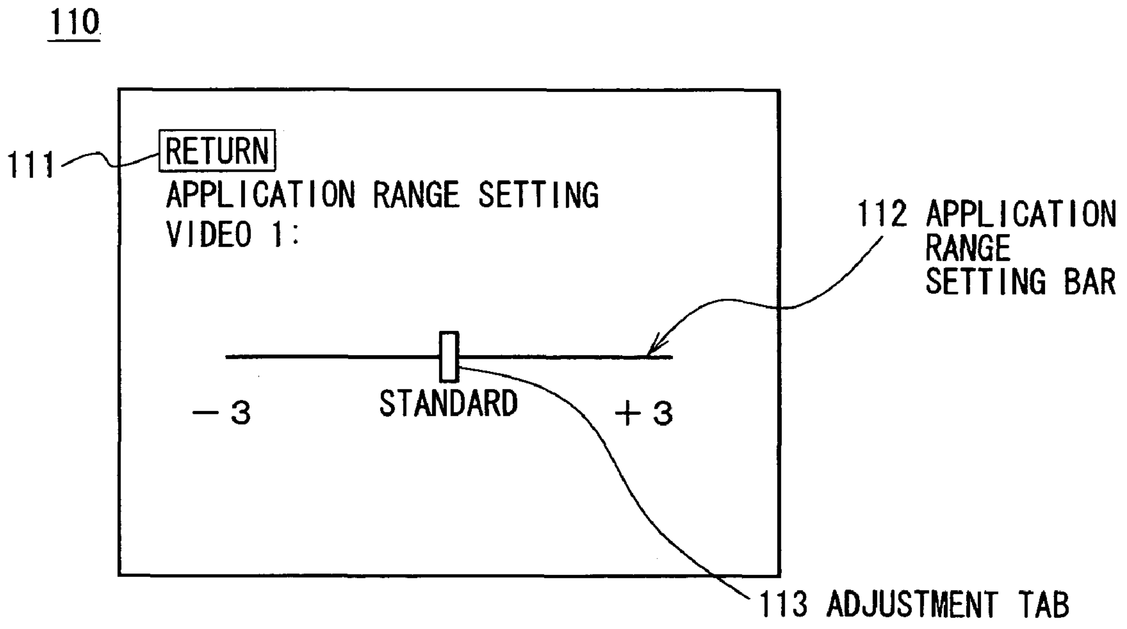
FIG. 5 is a brief diagram showing a configuration of a control values application range setting screen.

At step SP5, micon 2 displays control values application range setting screen 110 for setting movement settable control values application range DR2 of preamp control values PD used for controlling gains of digital satellite sound signals as shown in FIG. 5, for example, on the display 7 by reading control values application range setting screen corresponding to "APPLICATION RANGE SETTING" items 105 to 107 selected at step SP3 from internal memory and sending the screen to display 7, and continues to the next step SP6.

On control values application range setting screen 110, "RETURN" item 111 for returning to menu screen 100 (FIG. 4), application range setting bar 112 in the form of a line as a movable range indicator displaying the range where movement settable control values application range DR2 can be moved from the initial value against a group of preamp control available values PDS, and adjustment tab 113 as a movement indicator 112 provided on the application range setting bar 112 for indicating a direction and an amount of movement of movement settable control values application range DR2 are provided along with application range setting indicator RL for indicating the position of the minimum preamp control value PD in the movement settable control values application range DR2 below application range setting bar 112.

Micon 2 is adapted to make the position of the minimum preamp control value PD of movement settable control values application range DR2 to be indicated with adjustment tab 113 by moving adjustment tab 113 along application range setting bar 112 on control values application range setting screen 110 in response to manipulation on remocon 12 so that movement settable control values application range DR2 can be set against a group of preamp control available control values PDS.

At step SP6, micon 2 determines whether adjustment tab 113 is ordered to move along application range setting bar 112 on control values application range setting screen 110 via remocon 12 or not.

If the result obtained at step SP6 is negative, meaning that movement of adjustment tab 113 is not ordered via remocon 12, i.e., movement settable control values application range DR2 has not set (or changed) against a group of preamp control available values PDS, micon 2 continues to the next step SP8.

If the result obtained at step SP6 is positive, meaning that movement of adjustment tab 113 is ordered via remocon 12, i.e., the user requests to set (or change) movement settable control values application range DR2 against a group of preamp control available values PDS, micon 2 continues to the next step SP7.

Figure 6:
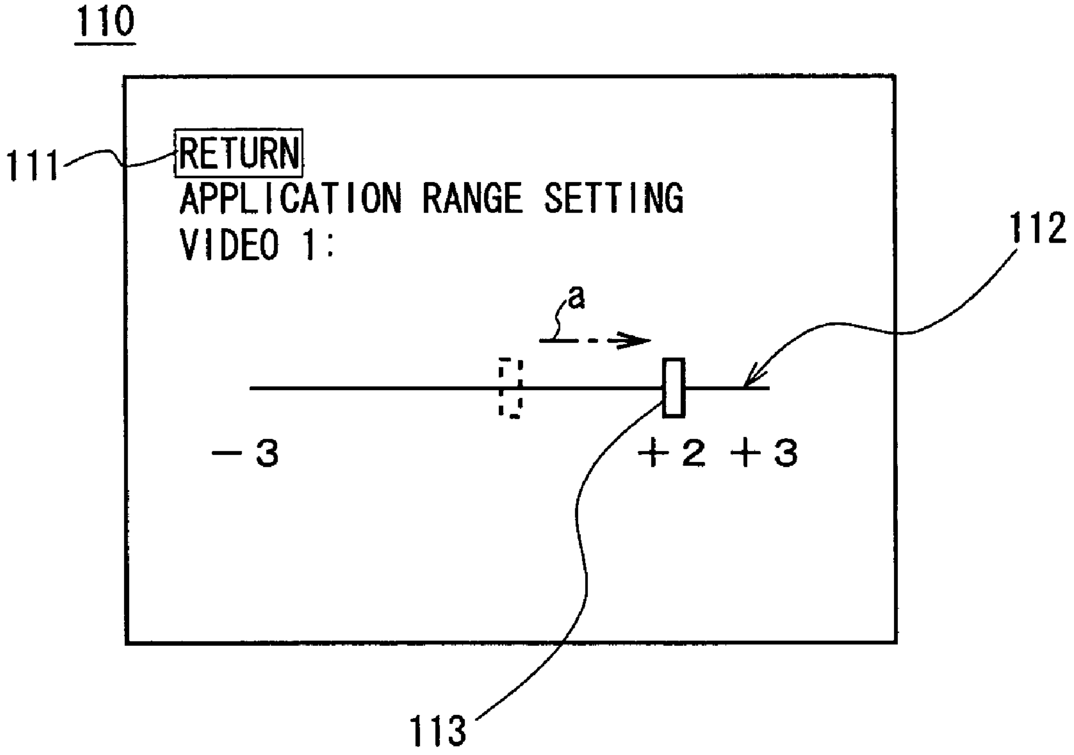
FIG. 6 is a brief diagram showing the setting of control values application range.

If adjustment tab 113 is moved toward the maximum preamp control value PD along application range setting bar 112 as shown by an arrow "a" on control values application range setting screen 110 in response to manipulation (order of movement) on remocon 12 as shown in FIG. 6, for example, so that minimum preamp control value PD of movement settable control values application range DR2 becomes the preamp control value PD at the position of application range setting indicator RL "+2" in step SP6, micon 2 sets movement settable control values application range DR2 in step SP7 so that a preamp control value PD associated with the application range setting indicator RL "+2" (i.e., preamp control value PD of "38" in hexa notification) becomes the minimum value.

Micon 2 updates application range setting value RLs represented by application range setting indicator RL and the minimum preamp control value PD of movement settable control values application range DR2 for "VIDEO 1" OI1 on control values application range setting table T100 (i.e., digital satellite sound signals) stored in control values storage part 17 as set control values application range information RF and also updates it as volume indicator correlation information VF representing correlation between the minimum value of volume indicator VM (i.e., "1") and the minimum preamp control value PD in movement settable control values application range DR2 as shown in FIG. 7. Then micon 2 continues to the next step SP8.

Hence, micon 2 is adapted to indicate 62 preamp control values PD that continues in the area larger than the minimum preamp control value PD of "38" in hexa notification (63 in all, including the minimum preamp control value PD in movement settable available control values application range DR2) on movement settable control values application range DR2 whose minimum value is a preamp control value of "38" in hexa notification on the basis of the contents of control values application range setting table T100 and also indicate correlation between the indicated preamp control value PD and volume indicator VM, for example when it switches the mode to digital broadcast viewing mode.

In control values application range setting table T100, application range setting values RLs "−1" represented by an application range setting indicator RL is stored as setting control values application range information RF against "VIDEO 2" OI2 (i.e., DVD playback sound signals) and a preamp control value PD of "2C" in hexa notification is stored as the minimum value in movement settable control values application range DR2.

In control values application range setting table T100, application range setting values RLs "−1" represented by an application range setting indicator RL is stored as setting control values application range information RF against "VIDEO 3" OI3 (i.e., video playback sound signals) and preamp control value PD of "3A" in hexa notification is stored as the minimum value of movement settable control values application range DR2.

As application range setting values RLs are indicated to each external input terminal OI, micon 2 can set movement settable control values application range DR2 for each external input terminal OI against a group of preamp control available values PDS and change each preamp control value PD within the movement settable control values application range DR2.

Micon 2 is also adopted to set (or change) movement settable control values application range DR2 against a group of preamp control available values PDS by moving adjustment tab 113 away from "STANDARD" along application range setting bar 112. Thus, micon 2 can provide a user with an intuitive visual recognition of how it is different from the standard control values application reference range DR1 in ground wave program viewing mode.

At step SP8, micon 2 determines whether "RETURN" item 111 is selected on control values application range setting screen 110 via remocon 12 or not.

If the result obtained at step SP8 is negative, meaning that movement settable control values application range DR2 has not been set (or changed) against a group of preamp control available values PDS or "RETURN" item 111 has not been selected on control values application range setting screen 110, micon 2 returns to step SP6.

If the result obtained at step SP8 is positive, meaning that the user selects to return to the display of menu screen 100 from that of control values application range setting screen 110, micon 2 switches the display from control values application range setting screen 110 to menu screen 100. Then micon 2 returns to step SP2 and repeats processes mentioned above.

Television receiver 1 is adapted to indicate a preamp control value PD to be associated with each volume indicator VM for each external input terminal OI by setting (or changing) movement settable control values application range DR2 against a group of preamp control available values PDS and changing preamp control values PD within the movement settable control values application range DR2 for each external input terminal OI.

Television receiver 1 is adapted to automatically move movement settable control values application range DR2 against a group of preamp control available values PDS on the basis of control values application range setting table T100 in response to the selection command through control values application range switching processing when a digital broadcasting selection command, a DVD selection command, a video selection command or a terrestrial selection command is entered via remocon 12.

Figure 8:
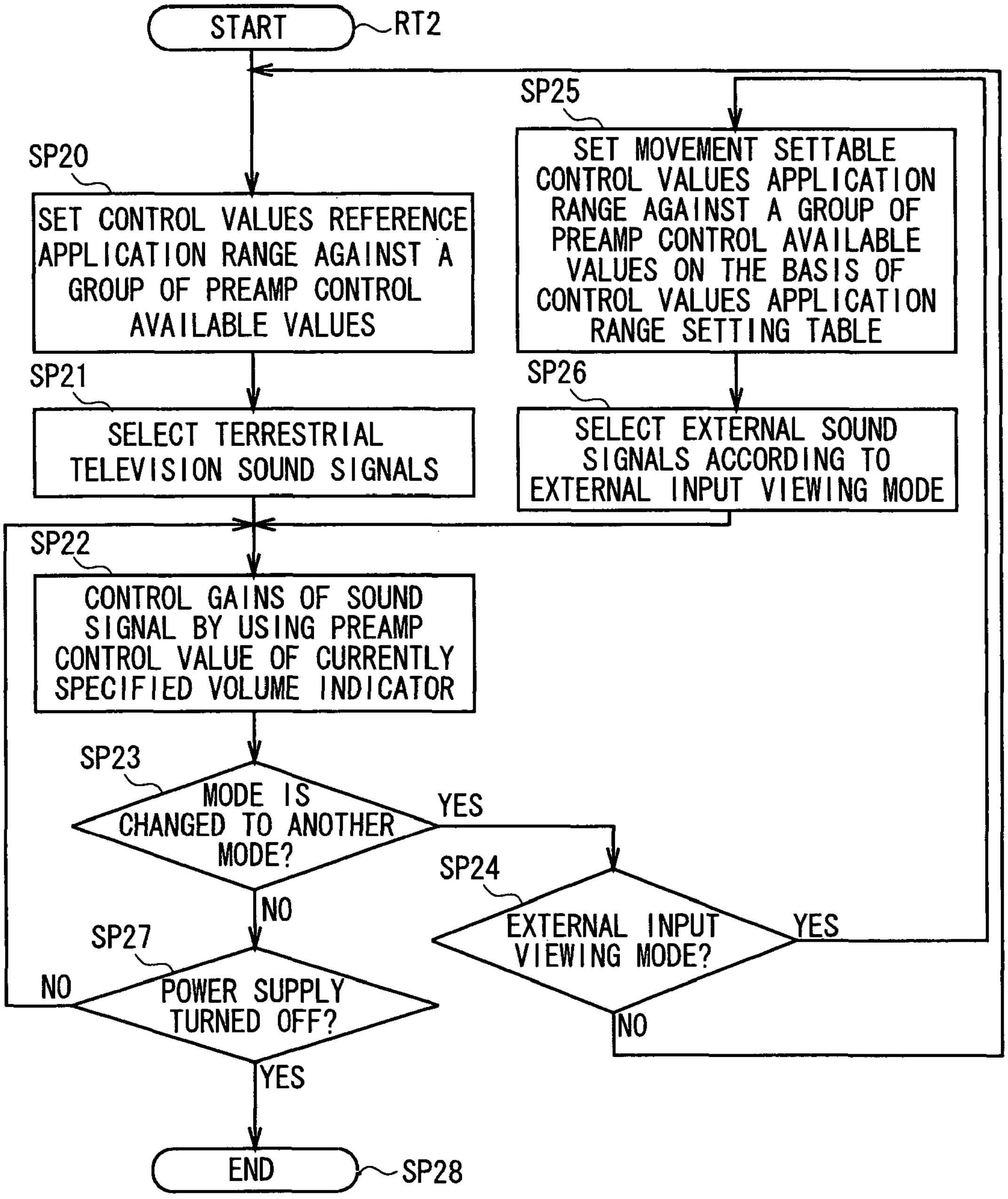
FIG. 8 is a flowchart showing a control values application range switching procedure.

Now, control values application range switching processing in television receiver 1 will be described with reference to a flowchart shown in FIG. 8. Image signals in selected image signals and sound signals at input switching part 6 will be omitted here and only sound signals will be described.

Actually, when micon 2 activates television receiver 1 in response to a television receiver 1 activation command entered via remocon 12, it sets the mode to ground wave program viewing mode, enters start step of routine RT2 and continues to step SP20. At step SP20, micon 2 sets control values reference application range DR1 against a group of preamp control available values PDS according to ground wave volume adjustment information and continues to the next step SP21.

At step SP21, micon 2 selects terrestrial television sound signals at input switching part 6 and sends the signals to preamp 8. Then micon 2 continues to the next step SP22.

At step SP22, micon 2 determines a preamp control value PD associated with currently indicated volume indicator VM on the basis of set control value reference application range DR1 against a group of preamp control available values PDS at step SP20, then obtains gains control television sound signals by controlling gains of terrestrial television sound signals with the determined preamp control value PD, and adjusts the volume of a television program sound on the basis of the gains control television sound signals. Then micon 2 continues to the next step SP23.

At step SP23, micon 2 determines whether the mode is changed from currently selected ground wave program viewing mode to other mode such as digital broadcast viewing mode, DVD playback viewing mode, or video playback viewing mode, or when digital broadcast viewing mode, DVD playback viewing mode or not, or video playback viewing mode is currently selected, whether the mode is changed to ground wave program viewing mode or not.

If the result obtained at step SP23 is positive, meaning that the mode is changed from the currently selected ground wave program viewing mode to other mode such as digital broadcast viewing mode, DVD playback viewing mode, or video playback viewing mode, or when digital broadcast viewing mode, DVD playback viewing mode or video playback viewing mode is currently selected, the mode is changed to ground wave program viewing mode, micon 2 continues to the next step SP24.

At step SP24, micon 2 determines whether the mode is changed from ground wave program viewing mode to digital broadcast viewing mode, DVD playback viewing mode, or video playback viewing mode (hereinafter collectively referred to as external input viewing mode) or not.

If the result obtained at step SP24 is positive, meaning that the user requests to view a digital satellite broadcasting program, a DVD playback image and sound, or video playback image and sound by changing the mode from currently selected ground wave program viewing mode to external input viewing mode, micon 2 continues to the next step SP25.

At step SP25, micon 2 sets movement settable control values application range DR2 against a group of preamp control available values PDS on the basis of control values application range setting table T100 according to the external input viewing mode entered via remocon 12, and continues to the next step SP26.

At step SP26, micon 2 selects any of digital satellite sound signals, DVD playback sound signals or video playback sound signals according to the external input viewing mode (hereinafter collectively referred to as external sound signals) at input switching part 6, and continues to the next step SP22.

At step SP22, micon 2 determines a preamp control value PD corresponding to currently specified volume indicator VM on the basis of movement settable control values application range DR2 set against a group of preamp control available values PDS at step SP24 with preamp 8, then obtains gains control external sound signals by controlling gains of external sound signals with the determined preamp control value PD, and adjusts the volume of external sound on the basis of the gains control external sound signals. Then micon 2 continues to the next step SP23.

If the result obtained at step SP24 is negative, meaning that the user requests to view terrestrial television broadcasting program by changing the mode from the currently selected external input viewing mode to ground wave program viewing mode, micon 2 returns to step SP20.

If the result obtained at step SP23 is negative, meaning that the currently selected ground wave program viewing mode or external input viewing mode is still maintained, micon 2 continues to the next step SP27.

At step SP27, micon 2 determines whether power supply to television receiver 1 is turned off via remocon 12 or not.

If the result obtained here is negative, meaning that the user requests to keep viewing the image and sound on the basis of the currently selected ground wave program viewing mode or external input viewing mode, micon 2 returns to step SP22.

If the result obtained at step SP27 is positive, meaning that the user requests to finish viewing the image and sound on the basis of ground wave program viewing mode or external input viewing mode, micon 2 continues to the next step SP28, where control values application range switching procedure ends.

According to the abovementioned configuration, television receiver 1 sets a movement settable control values application range DR2 individually against a group of preamp control available values PDS by making the position of the minimum preamp control value PD of movement settable control values application range DR2 within a range of application range setting indicator RL according to external sound signals supplied from an external input terminal OI, and determines a preamp control values PD within the movement settable control values application range DR2 (steps SP3 to SP7).

Hence, television receiver 1 can arbitrarily adjust gains of external sound signals with preamp control values PD within movement settable control values application range DR2 from the maximum to the minimum by setting movement settable control values application range DR2 against external sound signals supplied from each external input terminal OI so as to include a desired preamp control value PD according to external sound signals supplied from each external input terminal OI. In this manner, television receiver 1 can arbitrarily adjust the volume of an external sound on the basis of the external sound signals within the range of a desired minimum to a desired maximum (steps SP24 to 26, and SP22).

For example, when movement settable control values application range DR2 is set against a group of preamp control available values PDS so that the area close to the maximum preamp control value PD can be used to control gains of external sound signals as much as possible, television receiver 1 can control gains of external sound signals with a preamp control value PD, which is larger than the maximum preamp control value PD in control values reference application range DR1, for example. In this manner, television receiver 1 can adjust the volume of an external sound with a desired maximum preamp control value PD that further increases the volume of the external sound to suit the user's preference.

In this case, television receiver 1 can control gains of external sound signals by using a preamp control value PD that is larger than the minimum preamp control value PD within control value reference application range DR1 as the minimum value in movement settable control values application range DR2, for example. In this manner, television receiver 1 can adjust the volume of external sound with a desired minimum preamp control value PD that increases the volume of an external sound to suit the user's preference without muting the volume of the external sound.

For example, when movement settable control values application range DR2 is set against a group of preamp control available values PDS so that the area close to the minimum preamp control value PD can be used to control gains of external sound signals as much as possible, television receiver 1 can control gains of external sound signals with a preamp control value PD, which is smaller than the maximum preamp control value PD in control values reference application range DR1, for example. In this manner, television receiver 1 can adjust the volume of an external sound with a desired maximum preamp control value PD that decreases the volume of external sound to suit the user's preference.

Television receiver 1 can also control gains of external sound signals by using a preamp control value PD smaller than the minimum preamp control value PD in control value reference application range DR1. Even if the volume of an external sound cannot be completely muted, television receiver 1 can adjust the volume of an external sound by using a desired minimum preamp control value PD that mutes the volume of the external sound to suit the user's preference.

Even when a signal level of external sound signals supplied from external input terminal OI is different from that of terrestrial television sound signals and the same volume indicator indicates different volumes for respective signals, television receiver 1 can match the volume of a television program sound with that of an external sound without requiring a user to enter a volume change command from remocon 12 each time television receiver 1 changes the selection from terrestrial television sound signals to the external sound signal at input switching part 6. Television receiver 1 has previously set movement settable control values application range DR2 against a group of preamp control available values PDS to compensate external sound signals for the difference of signal level so that the same volume indicator VM indicates the same volume for different sounds.

On the other hand, even when a signal level of external sound signals supplied from external input terminal OI is the same as that of terrestrial television sound signals, a volume of the external sound can be adjusted to suit user's preference without each time requiring the user to enter a volume change command from remocon 12 in response to a selection of the external sound signals at input switching part 6 in television receiver 1. Television receiver 1 has previously set movement settable control values application range DR2 against a group of preamp control available values PDS so as to make it between a preferred minimum preamp control value and a preferred maximum control value for the external sound signals.

Television receiver 1 can control gains of external sound signals between a desired minimum preamp control value PD and a desired maximum preamp control value PD for each type of sound signals by arbitrarily setting different movement settable control values application range DR2 for different types of external sound signals against a group of preamp control available values PDS. In this manner, television receiver 1 can arbitrarily adjust a volume of an external sound on the basis of external sound signals between a desired minimum value and a desired maximum value without restriction.

If a preamp control value PD used for controlling gains of external sound signals is changed when movement settable control values application range DR2 is set against a group of preamp control available values PDS for each type of external sound signals, television receiver 1 maintains the length of movement settable control values application range DR2 and associates each preamp control value PD in movement settable control values application range DR2 with the same volume indicator VM, "1" to "63", relatively representing the volume of sound signals so that a volume of a sound can be adjusted by the same number of levels and a volume of a sound can be adjusted in the same manner with the same volume indicator VM when a user specifies a volume of a sound in ground wave program viewing mode and in external input viewing mode. Therefore, a user can adjust a volume of a sound on television receiver 1 whether it is in ground wave program viewing mode or external input viewing mode.

Television receiver 1 sets movement settable control values application range DR2 against a group of preamp control available values PDS for each external input terminal OI on the basis of an amount of adjustment tab 113 movement along application range setting bar 112 on control values application range setting screen 110 displayed on display part 7. Thus, television receiver 1 provides a user with an intuitive visual recognition of how movement settable control values application range DR2 is different from movement settable control values application range DR1 in a group of preamp control available values PDS on the basis of the amount of adjustment tab 113 movement along application range setting bar 112. In this manner, a preamp control value PD actually used for controlling gains of external sound signals within a group of preamp control available values PDS can be easily selected and set as movement settable control values application range DR2.

According to the abovementioned configuration, television receiver 1 arbitrarily sets movement settable control values application range DR2 for a plurality of continuous preamp control values PD from a desired minimum preamp control value PD to a desired maximum preamp control value PD against a group of preamp control available values PDS, in which preamp control values PD are ordered from a preamp control value PD for minimizing a volume of a sound through preamp control values PD for gradually increasing the volume of the sound to the maximum. Thus, television receiver 1 can control gains so as to compensate external sound signals with different signal levels for difference of signal level according to the external sound signal or can control gains within a predetermined range according to the signal level so that the volume of the external sound on the basis of the external sound signals can be arbitrarily adjusted in a range between a desired minimum value and a desired maximum value. In this manner, the external sound on the basis of the external sound signals can be adjusted.

Figure 9:
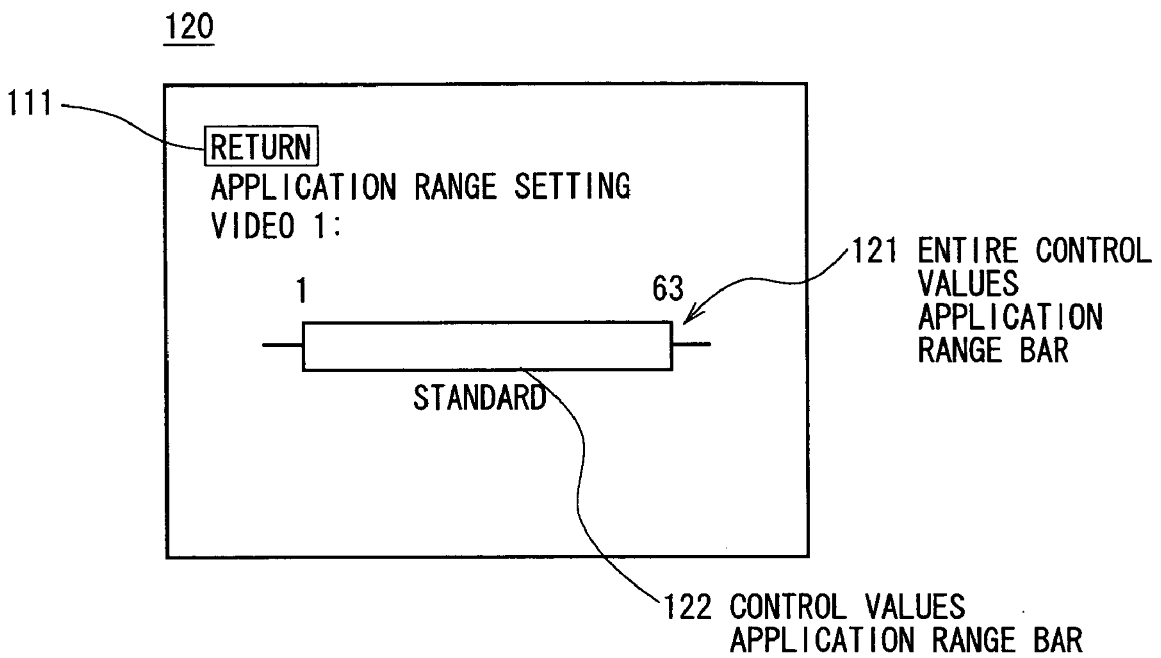
FIG. 9 is a brief diagram showing a configuration of a control values application range setting screen in another embodiment.

Although in the abovementioned embodiment, movement settable control values application range DR2 has been described to be set against a group of preamp control available control values PDS by moving adjustment tab 113 along application range setting bar 112 on control values application range setting screen 110 (FIG. 5), the present invention is not thus limited. Movement settable control values application range DR2 can also be set against a group of preamp control available values PDS by moving control values application range bar 122 visually representing movement settable control values application range DR2 from the minimum preamp control value PD to the maximum preamp control value PD on entire control values application range bar 121 visually representing the whole of a group of preamp control available values PDS on control values application range setting screen 120 as shown in FIG. 9, in which the same numerals indicate the same part as these in FIG. 5.

Figure 10:
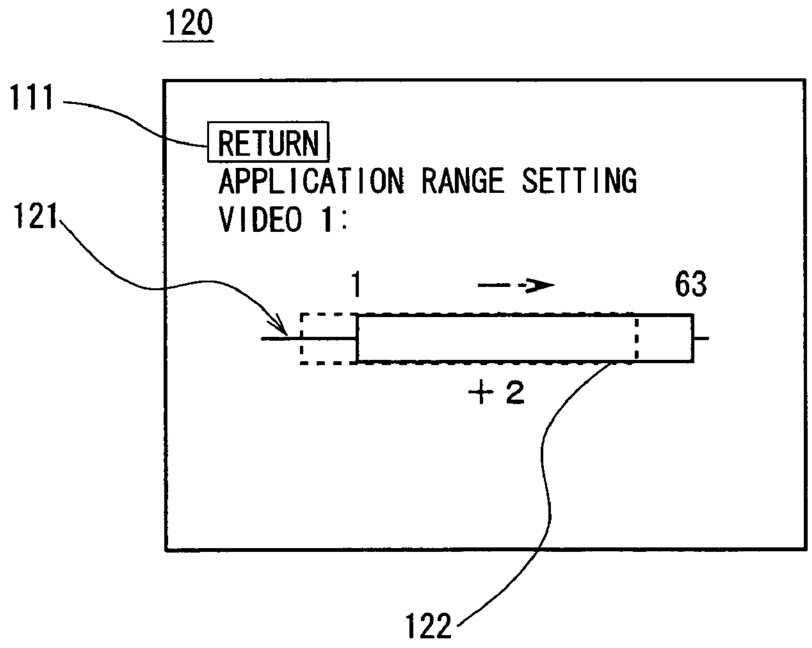
FIG. 10 is a brief diagram showing the setting of a control values application range in another embodiment.

In this case, as shown in FIG. 10, control values application range screen 120 can provide a user with more intuitive recognition through user's vision with respect to the place of all continuous preamp control values PD in a range from the minimum preamp control value PD to the maximum preamp control value PD in movement settable control values application range DR2 relative to a group of preamp control available values PDS is more intuitively recognized by a user through vision by allowing the user to move control values application range bar 122 along entire control values application range bar 121. Control values application setting screen 120 can also provide a user with intuitive recognition of correlation between a group of preamp control available values PDS and a volume indicator VM by displaying volume indicator VM from the minimum value to the maximum value ("1" to "63") above control values application range bar 122.

Although in the abovementioned embodiment, movement settable control values application range DR2 has been described to be visually set against a group of preamp control available control values PDS by moving adjustment tab 113 along application range setting bar 112 on control values application range setting screen 110, the present invention is not thus limited. The present invention can output an external sound that is currently set to movement settable control values application range DR2 on control values application range setting screen 110 and a television program sound for reference from speaker 10 alternatively in response to pressing of a sound switch button on remocon 12 so that user can set movement settable control values application range DR2 against a group of preamp control available values PDS by listening to and comparing a television program sound and an external sound with reference to currently specified volume indicator VM according to the position of adjustment tab 113 actually moved by the user when a user moves adjustment tab 113 along application range setting bar 112 on control values application setting screen 110. In this case, the present invention can provide a user with an easy recognition through the user's hearing sense with respect to the difference of correlation between volume indicator VM for terrestrial television sound signals or external sound signals and a preamp control value PD, while allowing the user to intuitively set a desired preamp control value PD through the user's vision as well as hearing sense. In this manner, the user can adjust the volume of the sound on the basis of sound signals to suit the user's preference.

Although in the abovementioned embodiment, control values reference application range DR1 has been described to be previously fixed against a group of preamp control available values PDS in ground wave program viewing mode and cannot be updated, the present invention is not thus limited. Control values reference application range DR1 can be set (or changed) against a group of preamp control available values PDS in the same manner for movement settable control values application range DR2 without restriction in ground wave program viewing mode as well as in digital broadcast viewing mode, DVD playback viewing mode and video playback viewing mode. In this case, a user can arbitrarily adjust the volume of a television program sound on the basis of terrestrial television sound signals within the range between a desired minimum and a desired maximum even in ground wave program viewing mode without restriction so that the user can adjust the volume of a television program sound on the basis of terrestrial television sound signals to suit the user's preference.

Although in the abovementioned embodiment, the length of movement settable control values application range DR2 between the minimum and the maximum has been described to be previously set, the present invention is not thus limited. Movement settable control values application range DR2 can be changed by allowing a user to set each of the minimum preamp control value PD and the maximum preamp control value PD of movement settable control values application range DR2 individually. In this case, as length of movement settable control values application range DR2 can be set differently for each external input terminal OI, the number of volume indicators to be specified within movement settable control values application range DR2. When a volume of a sound at the maximum volume indicator VM should be forced to stay low, the user can arbitrarily set only a position of the maximum preamp control value PD of movement settable control values application range DR against a group of preamp control available values PDS to a lower position. When the volume should be forced to stay low, such as at midnight, for example, the volume of an external sound is lowered for the audience even if volume indicator VM is specified to the maximum.

Although the abovementioned embodiment has been described to applied to each external sound signal supplied from digital broadcasting receiver 14, DVD player 15 or video tape recorder 16 connected to external input terminal OI, the present invention is not thus limited. The present invention can apply to a sound signal supplied from other various external appliances connectable to external input terminal OI, such as a television game appliance, or an internal appliance incorporated in a television receiver.

Although in the abovementioned embodiment, volume adjuster according to the present invention has been described to apply to television receiver 1, the present invention is not thus limited. The volume adjuster according to the present invention can be applied to HDTV (High Definition Television) receiver or other appliances such as an audiovisual apparatus, an AM radio receiver, an FM radio receiver, a CD player. In this case, movement settable control values application range DR2 can be set against a group of preamp control available values PDS on the basis of control values application range setting screen 110 displayed on a liquid crystal display on an audiovisual apparatus and a volume of a sound can be arbitrarily adjusted in a range from a desired minimum to a desired maximum for sound signals of AM radio broadcasting, FM radio broadcasting, etc.

Although the abovementioned embodiment has been described that the currently specified volume indicator VM should not be changed when movement settable control values application range DR2 is set against a group of preamp available values PDS, the present invention is not thus limited. The currently specified volume indicator VM can be changed to any volume indicator VM according to the setting of the movement settable control values application range DR2 when movement settable control values application range DR2 is set against a group of preamp control available values PDS. In this case, a user can recognize how movement settable control values application range DR2 is moved and set against a group of preamp control available values PDS with the changed volume indicator VM as an index.

Although in the abovementioned embodiment, control values application range table T100 as shown in FIG. 7 has been described to be stored in control values storage part 17, the present invention is not thus limited. All the continuous preamp control values PD between the minimum preamp control value PD and the maximum preamp control value PD in movement settable control values application range DR2 against a group of preamp control available values PDS as shown in FIGS. 2A and (B) can be stored in control values storage 17 for each external input viewing mode. The point is that information to set movement settable control values application range DR2 should be set to any position against a group of preamp control available values PDS for an external input viewing mode in control values storage part 17 when the mode switches to the external input viewing mode.

Although the abovementioned embodiment has been described that micon 2 and preamp 8 are applied as volume adjustment means, the present invention is not thus limited. MPU (Micro Processor Unit) or other various volume adjustment means such as other sound amplifiers can be applied.

Although the abovementioned embodiment has been described that micon 2 and display part 7 are applied as specifier movement control means, the present invention is not thus limited. MPU or other various specifier movement control means such as liquid crystal display can be applied.

As mentioned above, the present invention is adapted to adjust a volume of a sound on the basis of sound signals by determining a plurality of gains control values used for controlling the volume of the sound on the basis of the sound signals within multiple gains control values in a group of gains control available values according to a control values application range arbitrarily selected in the group of gains control available values stored in a storage means that has previously stored multiple gains control values used for controlling gains of sound signals in the form of a group of gains control available values, in which values from a gains control value for minimizing a volume of a sound through gains control values for gradually increasing the volume of the sound to the maximum are set orderly, so as to adjust a sound on the basis of the sound signals to each of different multiple volumes; and controlling gains of the sound signals by using gains control values corresponding to an arbitrarily specified volume of a sound of a plurality of gains control values within a control values application range. In this manner, a volume of a sound on the basis of the sound signals can be arbitrarily adjusted within a range from a desired minimum to a desired maximum by controlling gains to compensate sound signals whose signal level depends on the signal type for difference of signal level according to the signal type, or by controlling gains within a desired range corresponding to the signal level. Hence, the present invention can implement a device and a method for adjusting that can adjust a volume of a sound on the basis of sound signals to suit a user's preference.

INDUSTRIAL APPLICABILITY

This invention can be used for volume adjusters such as television receivers, radio receivers, and audiovisual apparatus.

DESCRIPTION OF REFERENCE NUMERALS

1 . . . TELEVISION RECEIVER, 2 . . . MICON, 6 . . . INPUT SWITCHING PART, 7 . . . DISPLAY PART, 8 . . . PREAMP, 9 . . . MAIN AMPLIFIER, 10 . . . SPEAKER, 14 . . . DIGITAL BROADCASTING RECEIVER, 15 . . . DVD PLAYER, 16 . . . VTR, 17 . . . CONTROL VALUES STORAGE PART

The invention claimed is:

1. A volume adjustment method, comprising:

a storing step of storing, in a storage means, first gain control values with a control values application range, the first gain control values are used for controlling gains of a sound signal from a sound source device to each of multiple volumes according to a specified range of gain control values selected from among the first gain control values, the number of gain control values in the specified range being less than the number of first gain control values;

a display step of displaying on a screen a menu of a plurality of source devices, and in response to a selection of the displayed source devices, displaying a movement specifier on a movable range indicator and a predetermined position on the movable range indicator concurrently on the screen, wherein the movement specifier being a movable bar that represents a position within the control values application range;

a specifier movement adjustment step of moving the movement specifier on the movable range indicator according to a movement specification on the movable range indicator against said movement indicator;

a control values application range determination step of determining the respective position within the control values application ranges of the selected source device against the first gain control values based on an amount of movement of the movement specifier moved on the movable range indicator, where the determined position within the control values application range of the selected source device includes a respective group of gain control values from the first gain control values, and the respective group of gain control values is used for adjusting gain of the respective sound signal from the selected source device;

an input specifying step for specifying a source device of the sound signal from among a plurality of input devices; and a volume adjustment step of adjusting the volume of the sound based on the sound signals by controlling gains of the sound signal with the gain control value corresponding to the volume of the sound specified among a plurality of the gain control values according to the gain control values selected according to the specified source device of the sound signal.

2. The volume adjustment method according to claim 1, further comprising:

an information association step of associating a plurality of the gain control values within the selected control values application range with volume information, wherein the volume information relatively represents the volume of the sound that can be adjusted with the plurality of the gain control values; and a volume information indication step of indicating each piece of the volume information associated with each of a plurality of the gain control values within the control values application range when the volume of the sound is arbitrarily specified.

3. The volume adjustment method of claim 1, wherein the first sound signal is terrestrial television signal, and the second sound signal is digital signal.

4. A volume adjuster, comprising a processor with memory to configure the processor to perform the following steps:

a storing step of storing, in a storage means, first gain control values with a control values application range, the first gain control values are used for controlling gains of a sound signal from a sound source device to each of multiple volumes according to a specified range of gain control values selected from among the first gain control values, the number of gain control values in the specified range being less than the number of first gain control values;

a display step of displaying on a screen a menu of a plurality of source devices, and in response to a selection of the displayed source devices, displaying a movement specifier on a movable range indicator and a predetermined position on the movable range indicator concurrently on the screen, wherein the movement specifier being a movable bar that represents a position within the control values application range;

a specifier movement adjustment step of moving the movement specifier on the movable range indicator according to a movement specification on the movable range indicator against said movement indicator;

a control values application range determination step of determining the respective position within the control values application ranges of the selected source device against the first gain control values based on an amount of movement of the movement specifier moved on the movable range indicator, where the determined position within the control values application range of the selected source device includes a respective group of gain control values from the first gain control values, and the respective group of gain control values is used for adjusting gain of the respective sound signal from the selected source device;

an input specifying step for specifying a source device of the sound signal from among a plurality of input devices; and a volume adjustment step of adjusting the volume of the sound based on the sound signals by controlling gains of the sound signal with the gain control value corresponding to the volume of the sound specified among a plurality of the gain control values according to the gain control values selected according to the specified source device of the sound signal.

5. The volume adjuster according to claim 4, wherein the steps further comprise:

an information association step for associating a plurality of the gains control values within the control values application range with volume information, wherein the volume information relatively represents the volume of the sound that can be adjusted with the plurality of the gain control values; and a volume information indication step for indicating each piece of the volume information associated with each of the plurality of said gain control values within the control values application range when the volume of the sound is arbitrarily specified.

6. The volume adjuster of claim 4, wherein the first sound signal is terrestrial television signal, and the second sound signal is digital signal.

* * * * *